US009041283B2

(12) United States Patent
Zhang

(10) Patent No.: US 9,041,283 B2
(45) Date of Patent: May 26, 2015

(54) LIGHT-EMITTING DEVICE PACKAGE

(71) Applicant: Samsung Electronics Co., Ltd., Suwon-si, Gyeonggi-do (KR)

(72) Inventor: Sung-uk Zhang, Suwon-si (KR)

(73) Assignee: Samsung Electronics Co., Ltd., Suwon-Si, Gyeonggi-Do (KR)

( * ) Notice: Subject to any disclaimer, the term of this patent is extended or adjusted under 35 U.S.C. 154(b) by 91 days.

(21) Appl. No.: 14/011,388

(22) Filed: Aug. 27, 2013

(65) Prior Publication Data

US 2014/0145582 A1 May 29, 2014

(30) Foreign Application Priority Data

Nov. 27, 2012 (KR) ........................ 10-2012-0135565

(51) Int. Cl.
| | |
|---|---|
| *H01J 1/62* | (2006.01) |
| *F21V 29/00* | (2006.01) |
| *H01L 33/48* | (2010.01) |
| *H01L 33/62* | (2010.01) |
| *H01L 25/16* | (2006.01) |

(52) U.S. Cl.
CPC ............. *F21V 29/004* (2013.01); *H01L 25/167* (2013.01); *H01L 33/486* (2013.01); *H01L 33/62* (2013.01); *H01L 2933/0033* (2013.01); *H01L 2933/0066* (2013.01); *H01L 2924/0002* (2013.01)

(58) Field of Classification Search
CPC ................................................. H01L 2924/00
USPC .................... 313/498, 506, 509, 512
See application file for complete search history.

(56) References Cited

U.S. PATENT DOCUMENTS

| | | | |
|---|---|---|---|
| 7,566,912 B2 | 7/2009 | Lee et al. | |
| 7,816,156 B2 | 10/2010 | Choi et al. | |
| 2005/0116322 A1* | 6/2005 | Sando et al. | ................... 257/676 |
| 2013/0015565 A1* | 1/2013 | Lin | ............................... 257/669 |

FOREIGN PATENT DOCUMENTS

| | | |
|---|---|---|
| JP | 2011-035264 A | 2/2011 |
| KR | 10-0580765 B1 | 5/2006 |
| KR | 10-0616692 B1 | 8/2006 |
| KR | 10-0902357 B1 | 6/2009 |
| KR | 10-2009-0104513 A | 10/2009 |
| KR | 10-2011-0119200 A | 11/2011 |
| KR | 10-1124254 B1 | 3/2012 |
| KR | 10-2012-0064161 A | 6/2012 |

* cited by examiner

*Primary Examiner* — Vip Patel
(74) *Attorney, Agent, or Firm* — McDermott Will & Emery LLP

(57) ABSTRACT

A light-emitting device package is provided including: a package substrate and a light-emitting device mounted on the package substrate. The package substrate includes first and second conductive regions each having a portion overlapping the light-emitting device. An electrode separator extends across the package substrate while penetrating the package substrate between the first and second conductive regions to electrically separate the first and second conductive regions from each other. A stress release portion surrounds at least a portion of each of the first and second conductive regions at an edge part of the package substrate. The stress release portion has different widths on both sides of the electrode separator interposed therebetween.

16 Claims, 15 Drawing Sheets

LIGHT-EMITTING DEVICE PACKAGE

CROSS-REFERENCE TO RELATED APPLICATIONS

This application claims the benefit of Korean Patent Application No. 10-2012-0135565, filed on Nov. 27, 2012, in the Korean Intellectual Property Office, the disclosure of which is incorporated herein in its entirety by reference.

TECHNICAL FIELD

The disclosure relates to a light-emitting device package, and more particularly, to a light-emitting device package including a package substrate having an electrode separator.

BACKGROUND

A light-emitting diode (LED) is a semiconductor light-emitting device for converting an electrical signal to light through a PN-junction of a compound semiconductor. Along with the spread of the usage field of an LED over various fields, such as an indoor/outdoor lighting field, a vehicle headlight field, display device back-light unit (BLU) field, a medical equipment field, and so forth, it is necessary to develop an LED package having a structure capable of securing reliability and durability of a product with cost-effective materials.

SUMMARY

The disclosure provides a light-emitting device package having a structure capable of securing reliability and durability of a product.

According to an aspect of the disclosure, there is provided a light-emitting device package including a package substrate and a light-emitting device mounted on the package substrate. The package substrate includes first and second conductive regions each having a portion overlapping the light-emitting device. An electrode separator extends across the package substrate while penetrating the package substrate between the first and second conductive regions to electrically separate the first and second conductive regions from each other. A stress release portion surrounds at least a portion of each of the first and second conductive regions at an edge part of the package substrate. The stress release portion has different widths on both sides of the electrode separator interposed therebetween.

According to another aspect of the disclosure, there is provided a light-emitting device package. The package substrate includes first and second conductive regions, which are separated from each other by an electrode separator, and a stress release portion surrounding at least a portion of each of the first and second conductive regions. A light-emitting device overlaps the first and second conductive regions and extends across the electrode separator. The stress release portion includes a first stress release portion, which has a first width and surrounds at least a portion of the first conductive region, and a second stress release portion, which has a second width that is wider than the first width and surrounds at least a portion of the second conductive region.

According to another aspect of the disclosure, a method of manufacturing a light-emitting package is provided comprising steps of forming first and second conductive regions on a package substrate and forming an electrode separator between the first and second conductive regions to electrically separate the first and second conductive regions from each other. A stress release portion is formed surrounding at least a portion of each of the first and second conductive regions at an edge part of the package substrate and having different widths on both sides of the electrode separator interposed therebetween, and a light-emitting device is mounted on the package substrate.

BRIEF DESCRIPTION OF THE DRAWINGS

Exemplary embodiments of the disclosure will be more clearly understood from the following detailed description taken in conjunction with the accompanying drawings.

DETAILED DESCRIPTION

Figure 1A:
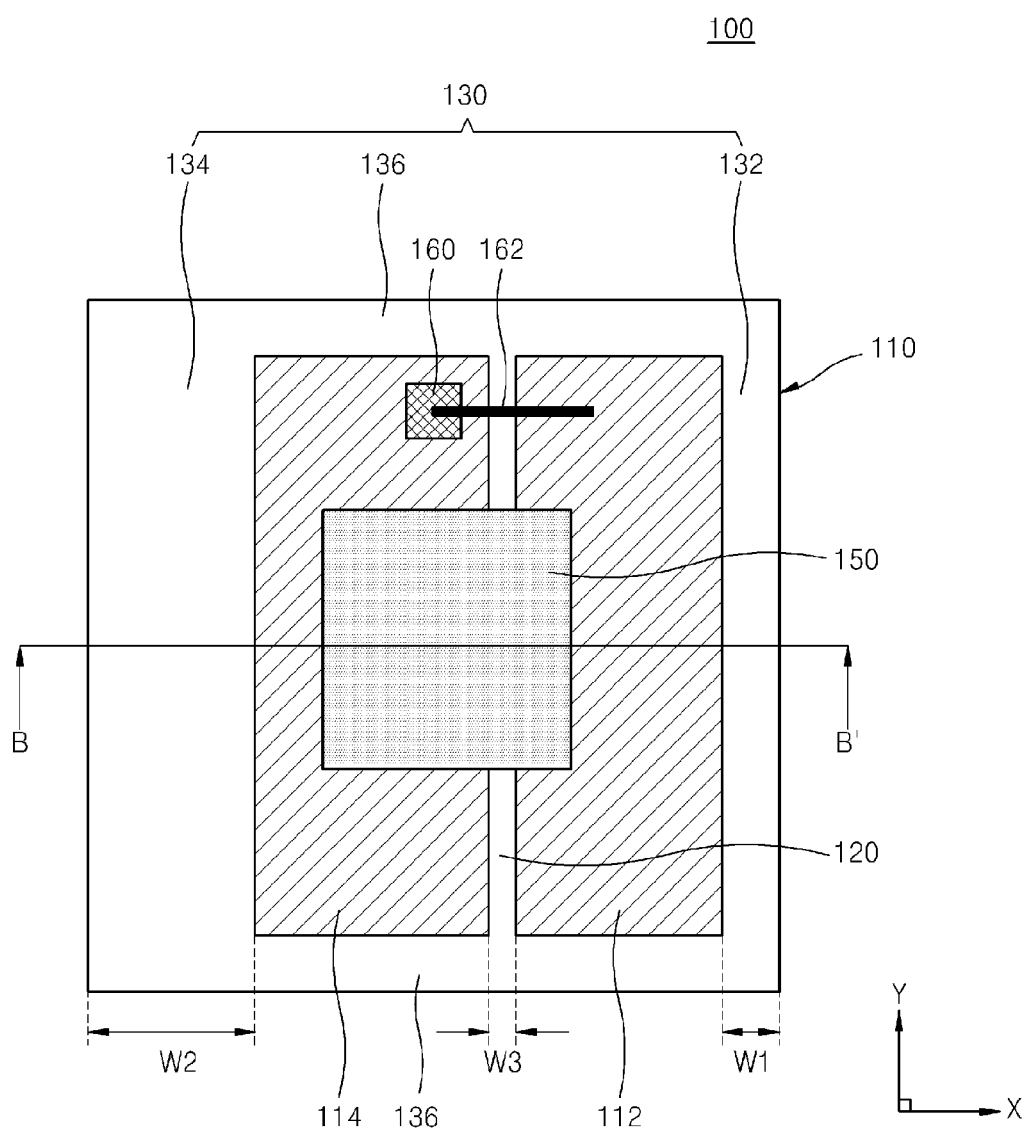
FIG. 1A is a plan view of a main structure of a light-emitting device package according to an embodiment of the disclosure.

Exemplary embodiments of the disclosure will now be described in detail with reference to the accompanying drawings. Like reference numerals in the drawings denote like elements, and thus their repetitive description will be omitted.

The embodiments are provided to describe the disclosure more fully to one of ordinary skill in the art. The disclosure, however, may be embodied in many different forms and should not be construed as being limited to the embodiments set forth herein. Rather, these embodiments are provided so that this disclosure will be thorough and complete, and will fully convey the concept of the disclosure to one of ordinary skill in the art.

Although terms, such as 'first' and 'second', are used to describe various members, regions, layers, parts and/or elements, it is obvious that these members, regions, layers, parts and/or elements cannot be limited by the terms. The terms do not indicate a specific sequence, top and bottom, or superior and inferior and are only used to classify a certain member, region, part, or element from another member, region, part, or element. Therefore, a first member, region, part, or element to be described below can be named a second member, region, part, or element without leaving the introduction of the disclosure. For example, the first element can be named the second element without departing from the scope of the disclosure, and likewise the second element can be named the first element.

All terms used herein including technical or scientific terms have the same meaning as those generally understood by one of ordinary skill in the art unless they are defined otherwise. It should be understood that terms generally used, which are defined in a dictionary, have the same meaning as in a context of related technology, and the terms are not understood as excessively formal meaning unless they are clearly defined in the application.

When a certain embodiment can be differently implemented, a specific process sequence may be performed differently from a described sequence. For example, two sequential processes to be described below may be substantially performed at the same time or may be performed in a sequence that is opposite to the described sequence.

In the accompanying drawings, modifications of shown shapes may be predicted according to, for example, a manufacturing technique and/or tolerance. Therefore, the embodiments of the disclosure should not be construed as being limited to specific shapes of regions shown in the specification, and should include, for example, a change in shapes caused in a manufacturing process.

As used herein, the term "and/or" includes any and all combinations of one or more of the associated listed items. Expressions such as "at least one of," when preceding a list of elements, modify the entire list of elements and do not modify the individual elements of the list.

Figure 1B:
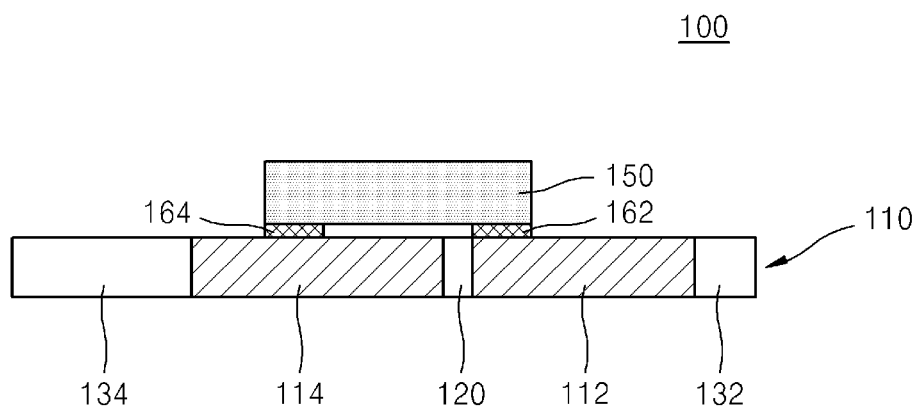
FIG. 1B is a cross-sectional view of line B-B' of FIG. 1A.

FIG. 1A is a plan view of a main structure of a light-emitting device package 100 according to an embodiment of the disclosure. FIG. 1B is a cross-sectional view of line B-B' of FIG. 1A.

Referring to FIGS. 1A and 1B, the light-emitting device package 100 may include a package substrate 110 and a light-emitting device 150 mounted on the package substrate 110. The package substrate 110 supports the light-emitting device 150. The package substrate 110 may be connected to an external printed circuit board (PCB, not shown).

The package substrate 110 includes first and second conductive regions 112 and 114 each having a portion overlapping the light-emitting device 150, an electrode separator 120 for electrically separating the first and second conductive regions 112 and 114 from each other, and a stress release portion 130 formed at an edge part of the package substrate 110.

To electrically connect the light-emitting device 150 to the first and second conductive regions 112 and 114, a first conductive bonding layer 162 and a second conductive bonding layer 164 are interposed between the light-emitting device 150 and the first and second conductive regions 112 and 114, respectively. Any one of a cathode and an anode of the light-emitting device 150 may be connected to the first conductive region 112 via the first conductive bonding layer 162, and the other one thereof may be connected to the second conductive region 114 via the second conductive bonding layer 164. In some embodiments, the cathode of the light-emitting device 150 may be connected to the first conductive region 112, and the anode thereof may be connected to the second conductive region 114. In some other embodiments, the cathode of the light-emitting device 150 may be connected to the second conductive region 114, and the anode thereof may be connected to the first conductive region 112.

Areas of the first and second conductive regions 112 and 114 in the package substrate 110 may be the same or different from each other. In some embodiments, the area of the second conductive region 114 may be greater than the area of the first conductive region 112.

The package substrate 110 may include a metal having higher thermal conductivity than that of plastic or ceramic. To maximize a heat radiation characteristic of the package substrate 110, the first and second conductive regions 112 and 114 may be formed of a metal. In some embodiments, the first and second conductive regions 112 and 114 may be formed of at least one material selected from the group consisting of aluminum (Al), copper (Cu), magnesium (Mg), zinc (Zn), titanium (Ti), tantalum (Ta), hafnium (Hf), niobium (Nb), aluminum nitride (AlN), silicon carbide (SiC), and an alloy of them.

When the first and second conductive regions 112 and 114 are formed of a metal, the first and second conductive regions 112 and 114 may support the light-emitting device 150 and may also function as a heat sink for radiating heat generated by the light-emitting device 150.

In some embodiments, the light-emitting device 150 may include a light-emitting diode (LED) chip. The LED chip may emit light of blue, green, red, or the like according to a type of a compound semiconductor forming the LED chip. Alternatively, the LED chip may emit ultraviolet (UV) rays. In some other embodiments, the light-emitting device 150 may include a UV optical diode chip, a laser diode chip, or an organic LED (OLED) chip. However, according to the disclosure, the light-emitting device 150 is not limited to the illustrations and may include various optical devices.

The electrode separator 120 extends across the package substrate 110 in a first direction (the Y-axis direction in FIG. 1A) while penetrating the package substrate 110 in a thickness direction of the package substrate 110 by being interposed between the first and second conductive regions 112 and 114.

The stress release portion 130 alleviates a thermal stress of the light-emitting device 150. The stress release portion 130 extends along the edge part of the package substrate 110 to fully surround the first and second conductive regions 112 and 114. However, the disclosure is not limited thereto. In some embodiments, the stress release portion 130 may extend along a portion of the edge part of the package substrate 110 to surround a portion of the first conductive region 112 or a portion of the second conductive region 114. The stress release portion 130 extends with a width wider than that of the electrode separator 120.

In some embodiments, the electrode separator 120 and the stress release portion 130 may be formed of a same material, but the disclosure is not limited thereto.

In some embodiments, the electrode separator 120 and the stress release portion 130 may be formed of an insulative metal oxide film. For example, the electrode separator 120 and the stress release portion 130 may be formed of an insulative metal oxide film obtained by anodizing Al, Mg, Zn, Ti, Ta, Hf, or Nb. In an illustrative process to obtain the electrode separator 120 and the stress release portion 130 formed of a metal oxide film obtained by an anodizing treatment, a metal substrate is prepared, and a region to be separated from the metal substrate may be selectively anodized. For the anodizing treatment, a separate jig may be produced to directly perform the anodizing treatment. Alternatively, a desired mask pattern is formed on the metal substrate, and regions partially exposed through the mask pattern from the metal substrate may be anodized. After the anodizing treatment, the mask pattern is removed, and an electrolytic grinding process may be further performed to adjust surface illuminations of the surface of the metal substrate, which is exposed by removing the mask pattern, and the anodizing-treated surface. The portion of the metal substrate, which is exposed by removing the mask pattern, may be used for the first and second conductive regions 112 and 114.

The electrode separator 120 may function to electrically separate the first and second conductive regions 112 and 114 from each other and may also function to radiate heat generated by the light-emitting device 150 to the outside. The stress release portion 130 may function to alleviate a thermal stress of the light-emitting device 150 and may also function to radiate heat generated by the light-emitting device 150 to the outside.

In some other embodiments, the electrode separator 120 and the stress release portion 130 may be formed of an insulation material without a metal. For example, the electrode separator 120 and the stress release portion 130 may be formed of an insulation resin. In some embodiments, the insulation resin may include epoxy, polyphthalamide (PPA), liquid crystal polymer (LCP), polyphenylene sulfide (PPS), or polyetheretherketone (PEEK). In an illustrative embodiment to form the electrode separator 120 and the stress release portion 130 formed of an insulation material without a metal, processes of forming a mask pattern on a metal substrate, forming a hole by etching a region that is exposed through the mask pattern, and filling the insulation material inside the hole may be performed.

Although materials forming the electrode separator 120 and the stress release portion 130 and methods of forming the electrode separator 120 and the stress release portion 130 have been illustrated, according to the disclosure, a material and a forming method of the electrode separator 120 and the stress release portion 130 are not limited to the illustrations and may be variously modified and changed.

The electrode separator 120 is formed at a location shifted towards one side from the center of the package substrate 110. Thus, areas of both sides of the package substrate 110 based on the electrode separator 120 are different from each other. The first conductive region 112 is located at a part having a relatively small area in the package substrate 110 divided into two parts by the electrode separator 120, and the second conductive region 114 is located at a part having a relatively large area in the package substrate 110 divided into the two parts by the electrode separator 120.

The stress release portion 130 includes a first stress release portion 132 extending in parallel to the electrode separator 120 at the part having a relatively small area in the package substrate 110 divided into the two parts by the electrode separator 120, and a second stress release portion 134 extending in parallel to the electrode separator 120 at the part having a relatively large area. The first and second stress release portions 132 and 134 are located at both sides of the light-emitting device 150 interposed therebetween. The first stress release portion 132 surrounds a portion of the first conductive region 112, and the second stress release portion 134 surrounds a portion of the second conductive region 114. The first and second stress release portions 132 and 134 are integrally connected by a connection part 136 extending therebetween. Although it is shown in FIG. 1A that the first and second stress release portions 132 and 134 are connected in parallel to each other, the disclosure is not limited thereto.

The first and second stress release portions 132 and 134 have different widths. In particular, the first and second stress release portions 132 and 134 may have different widths at a portion at which the first and second stress release portions 132 and 134 cross a certain direct line passing through the light-emitting device 150 in a second direction (the X-axis direction). As shown in FIGS. 1A and 1B, the first stress release portion 132 may extend in the first direction (the Y-axis direction of FIG. 1A) with a first width W1 near one side of the light-emitting device 150, and the second stress release portion 134 may extend in the first direction with a second width W2 that is wider than the first width W1 near the other side of the light-emitting device 150.

In the second direction (the X-axis direction), each of the first width W1 of the first stress release portion 132 and the second width W2 of the second stress release portion 134 is wider than a width W3 of the electrode separator 120.

In certain embodiments, on the package substrate, the first stress release portion 132, the second stress release portion 134, and the electrode separator 120 extend in parallel to each other.

The light-emitting device 150 is disposed to cross the electrode separator 120 so as to overlap the first and second conductive regions 112 and 114. Although an overlap area of the light-emitting device 150 and the second conductive region 114 may be greater than an overlap area of the light-emitting device 150 and the first conductive region 112, the disclosure is not limited thereto.

When the stress release portion 130 does not exist on the package substrate 110 including the electrode separator 120, the areas of the first and second conductive regions 112 and 114 may be further expanded as much as the area occupied by the stress release portion 130. In this case, a difference between the areas respectively occupied by the first and second conductive regions 112 and 114 located at both sides of the electrode separator 120 interposed therebetween may be greater than the former case. Thus, a thermal stress applied from the first and second conductive regions 112 and 114 to the light-emitting device 150 may be greater than the former case.

In particular, in a bonding process to attach the light-emitting device 150 onto the package substrate 110, when a temperature of the package substrate 110 increases, because thermal expansion coefficients of the first and second conductive regions 112 and 114 and the electrode separator 120 are different from each other, a relatively large thermal stress may be applied from the package substrate 110 to the light-emitting device 150. For example, when the light-emitting device 150 is fixed onto the package substrate 110 by forming the first conductive bonding layer 162 and the second conductive bonding layer 164 by a eutectic die attach process, a temperature of the package substrate 110 may increase to about 300° C. or more. At this time, a relatively large thermal stress may be applied to the light-emitting device 150 due to the thermal expansion coefficient difference between the first and second conductive regions 112 and 114 and the electrode separator 120, and as a result, a crack may occur at a part of the light-emitting device 150, which is adjacent to the first conductive bonding layer 162 and the second conductive bonding layer 164, thereby forming bad product in a light-emitting device package manufacturing process. In addition, during the use of a product including the light-emitting device package 100, abnormalities, such as cracks, may be caused by a thermal stress applied from the package substrate 110 of the light-emitting device package 100 to the light-emitting device 150, thereby reducing a product life span.

However, according to some embodiments according to the disclosure, the light-emitting device package 100 includes the stress release portion 130 surrounding the first and second conductive regions 112 and 114 on the package substrate 110 including the first and second conductive regions 112 and 114. In particular, to reduce the difference between the area occupied by the first conductive region 112 and the area occupied by the second conductive region 114, the second stress release portion 134 having a width wider than that of the first stress release portion 132 is formed around the second conductive region 114. Thus, the influence of heat generated by the first and second conductive regions 112 and 114 may be evenly spread over the whole light-emitting device 150. Accordingly, compared with a case where the stress release portion 130 does not exist, the thermal stress at the light-emitting device 150 may be reduced, and as a result, crack occurrence, life span reduction, and the like due to the thermal stress may be prevented.

The first conductive bonding layer 162 and the second conductive bonding layer 164 may be formed of a metallic material having excellent electric conductivity and adhesion properties. In some embodiments, each of the first conductive bonding layer 162 and the second conductive bonding layer 164 may be formed of gold (Au), tin (Sn), lead (Pb), silver (Ag), indium (In), germanium (Ge), silicon (Si), or a combination of them. For example, the first conductive bonding layer 162 and the second conductive bonding layer 164 may be formed of an Au—Sn alloy, a Pb—Ag—In alloy, a Pb—Ag—Sn alloy, a Pb—Sn alloy, an Au—Ge alloy, an Au—Si alloy, or Au. The first conductive bonding layer 162 and the second conductive bonding layer 164 may be formed using the eutectic die attach process.

Although FIGS. 1A and 1B show a structure using the first conductive bonding layer 162 and the second conductive bonding layer 164 to electrically connect the light-emitting device 150 to the package substrate 110, the disclosure is not limited thereto. For example, to electrically connect the light-emitting device 150 to the package substrate 110, conductive wires or solder bumps may be used instead of the first conductive bonding layer 162 and the second conductive bonding layer 164.

The light-emitting device package 100 may further include a zener diode 160 mounted on any one of the first and second conductive regions 112 and 114. Although FIG. 1A shows a structure in which the zener diode 160 is attached onto the second conductive region 114, the disclosure is not limited thereto, and various modifications may be performed.

The zener diode 160 may function to protect the light-emitting device 150 from static electricity, which may occur around the light-emitting device package 100, a sudden change in a voltage supplied to the light-emitting device 150, or the like. The zener diode 160 is a diode having the property that the diode is turned on in a reverse direction if a potential difference equal to or greater than a zener voltage (breakdown voltage) is applied in the reverse direction. Any one of an anode and a cathode of the zener diode 160 may be directly attached onto the second conductive region 114 to be electrically connected to the second conductive region 114. The other one of the anode and the cathode of the zener diode 160 may be electrically connected to the first conductive region 112 through a wire 162. That is, the zener diode 160 may be connected in parallel to the light-emitting device 150. Accordingly, when an overvoltage occurs at the light-emitting device package 100, current may flow through the zener diode 160, thereby protecting the light-emitting device 150 from the overvoltage. In some embodiments, the light-emitting device package 100 may not include the zener diode 160.

FIGS. 2A to 2D are perspective views according to a process sequence to describe an illustrative method of manufacturing the package substrate 110 illustrated in FIGS. 1A and 1B.

Figure 2A:
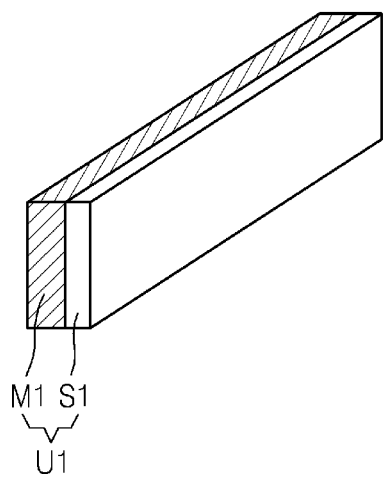
FIGS. 2A to 2D are perspective views according to a process sequence to describe an illustrative method of manufacturing a package substrate illustrated in FIGS. 1A and 1B.

Referring to FIG. 2A, a metal substrate M1 is prepared, and an insulative metal oxide film 51 having a predetermined thickness is formed on one surface of the metal substrate M1 by an anodizing process to form a sub-structure U1 having a layered structure of the metal substrate M1 and the insulative metal oxide film 51.

Figure 2B:
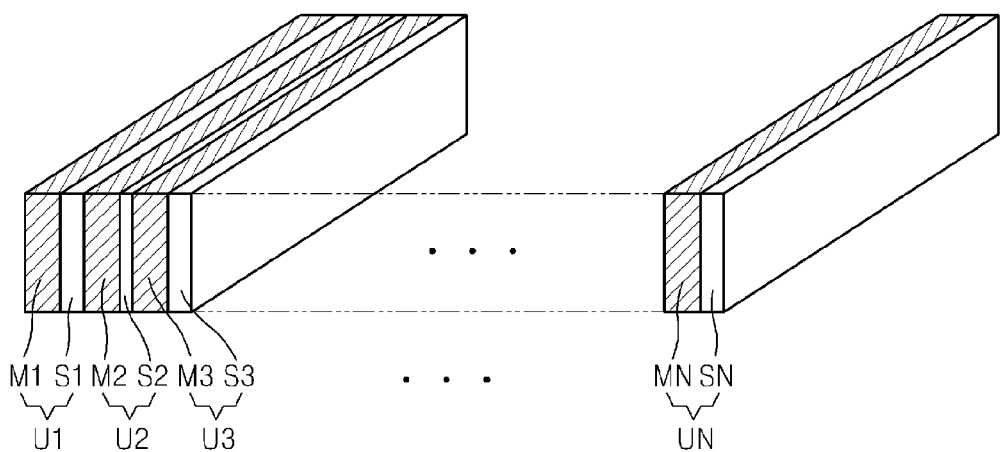

Referring to FIG. 2B, a plurality of sub-structures U2, U3, . . . , UN, in which first metal oxide films S2, S3, . . . , SN are respectively formed on one surfaces of metal substrates M2, M3, . . . , MN, are further formed using a similar process to that described with reference to FIG. 2A, and the plurality of sub-structures U1, U2, U3, . . . , UN are sequentially bonded in series.

The metal substrate M1 may be formed of Al, Mg, Zn, Ti, Ta, Hf, or Nb. In some embodiments, an adhesive may be used to increase a bonding force when the plurality of sub-structures U1, U2, U3, . . . , UN are bonded, but the disclosure is not limited thereto.

At least some of the metal oxide films S1, S2, S3, . . . , SN in the plurality of sub-structures U1, U2, U3, . . . , UN may have different thicknesses. For example, the thickness of each of the metal oxide films S1, S2, S3, . . . , SN may be determined by considering the width W3 of the electrode separator 120 and the width of the stress release portion 130 included in the package substrate 110 of the light-emitting device package 100 shown in FIGS. 1A and 1B.

Figure 2C:
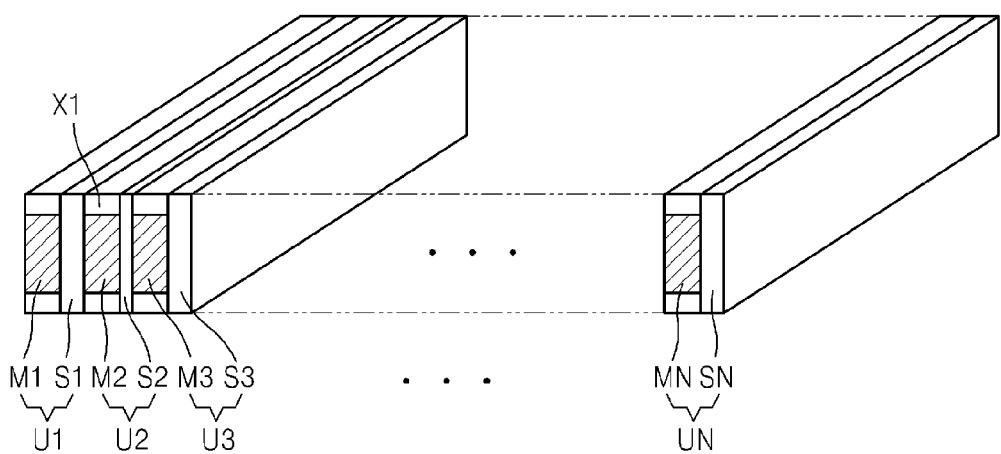

Referring to FIG. 2C, the anodizing process is performed for exposed surfaces of the metal substrates M1, M2, M3, . . . , MN from the result of FIG. 2B to form a structure 10 in which a second metal oxide film X1 is formed on the exposed surfaces.

Figure 2D:
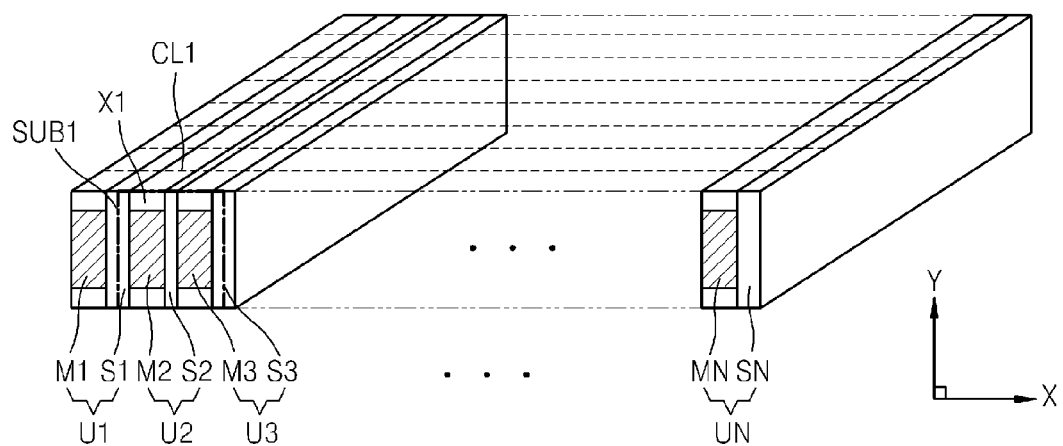

Referring to FIG. 2D, in certain embodiments, the structure 10 is cut along cutting lines marked as broken lines CL1 extending in the X-axis direction, resulting in a plurality of package substrates of the same size, each having a part marked with a quadrangle SUB1 illustrated by alternating long and short dashed lines as the upper surface. Each of the plurality of package substrates may be used as the package substrate 110 shown in FIGS. 1A and 1B.

FIGS. 3A to 3D are plan views according to a process sequence to describe another illustrative method of manufacturing the package substrate 110 illustrated in FIGS. 1A and 1B.

Figure 3A:
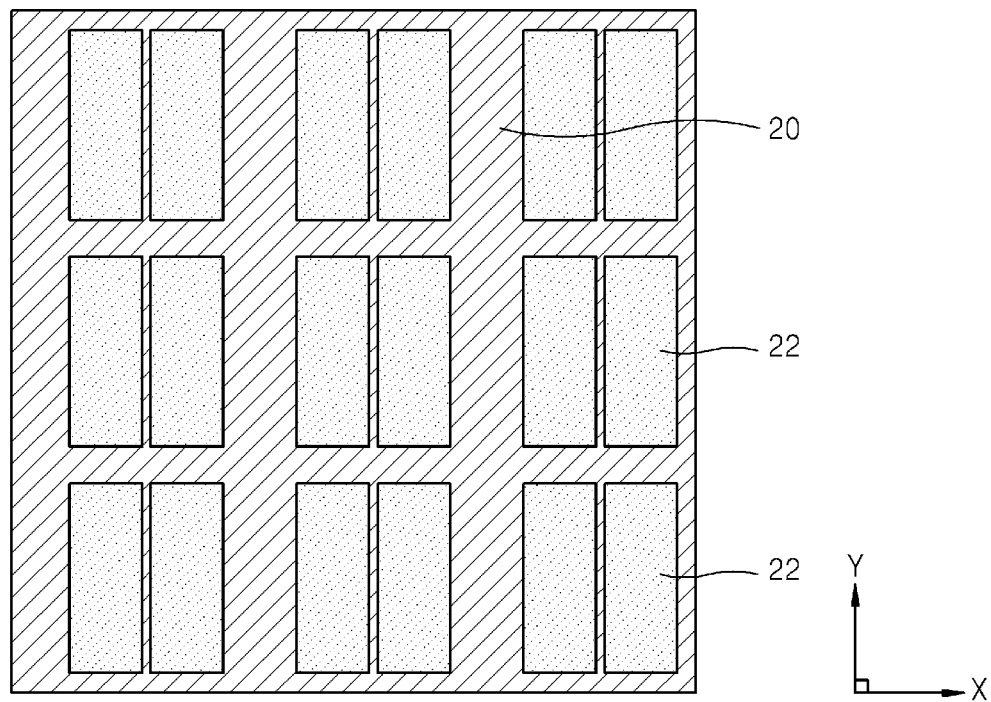
FIGS. 3A to 3D are plan views according to a process sequence to describe another illustrative method of manufacturing a package substrate illustrated in FIGS. 1A and 1B.

Referring to FIG. 3A, a metal substrate 20 is prepared, a mask pattern 22 having a desired pattern shape is formed on the upper surface of the metal substrate 20, and a portion of the upper surface of the metal substrate 20 is exposed through the mask pattern 22.

The metal substrate 20 may be formed of Al, Mg, Zn, Ti, Ta, Hf, or Nb. The mask pattern 22 may be formed of a photoresist film.

Figure 3B:
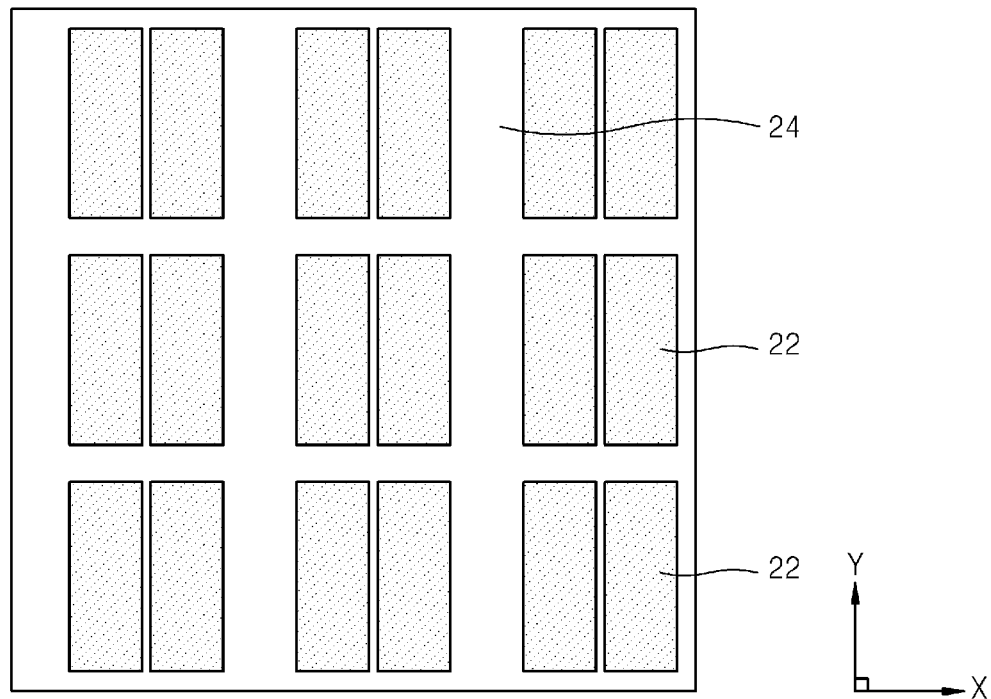

Referring to FIG. 3B, the upper surface of the metal substrate 20, which is exposed through the mask pattern 22, is anodized to form an insulative metal oxide film 24 penetrating the metal substrate 20.

The insulative metal oxide film 24 may form the electrode separator 120 and the stress release portion 130 included in the package substrate 110 of the light-emitting device package 100 shown in FIGS. 1A and 1B.

Figure 3C:
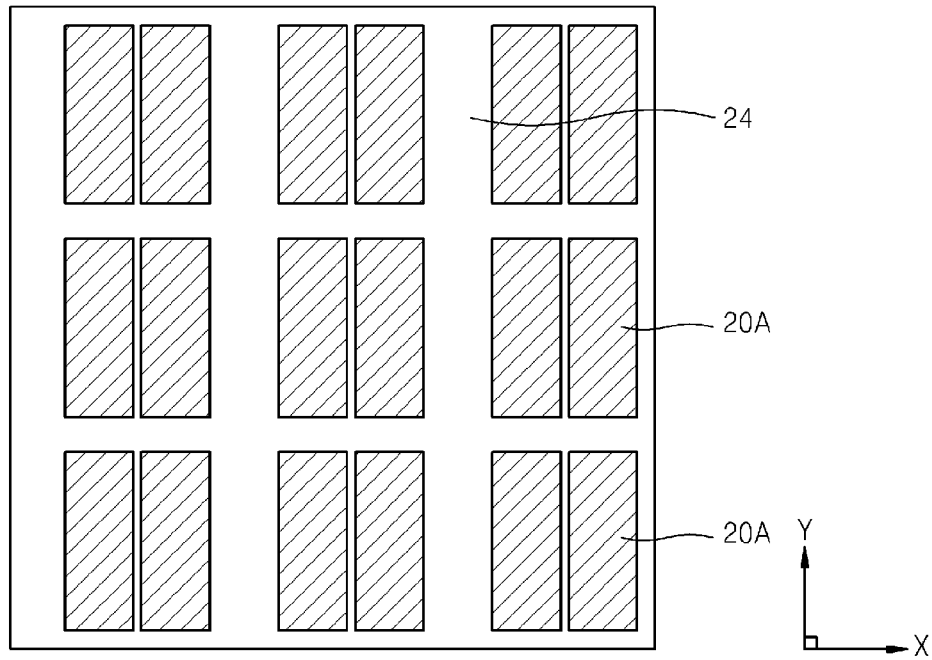

Referring to FIG. 3C, the mask pattern 22 is removed to expose a plurality of conductive regions 20A of the metal substrate 20.

In some embodiments, to match roughness of the surfaces of the plurality of conductive regions 20A with roughness of the surface of the insulative metal oxide film 24, the surface roughness may be adjusted using an electrolytic grinding method or the like.

Figure 3D:
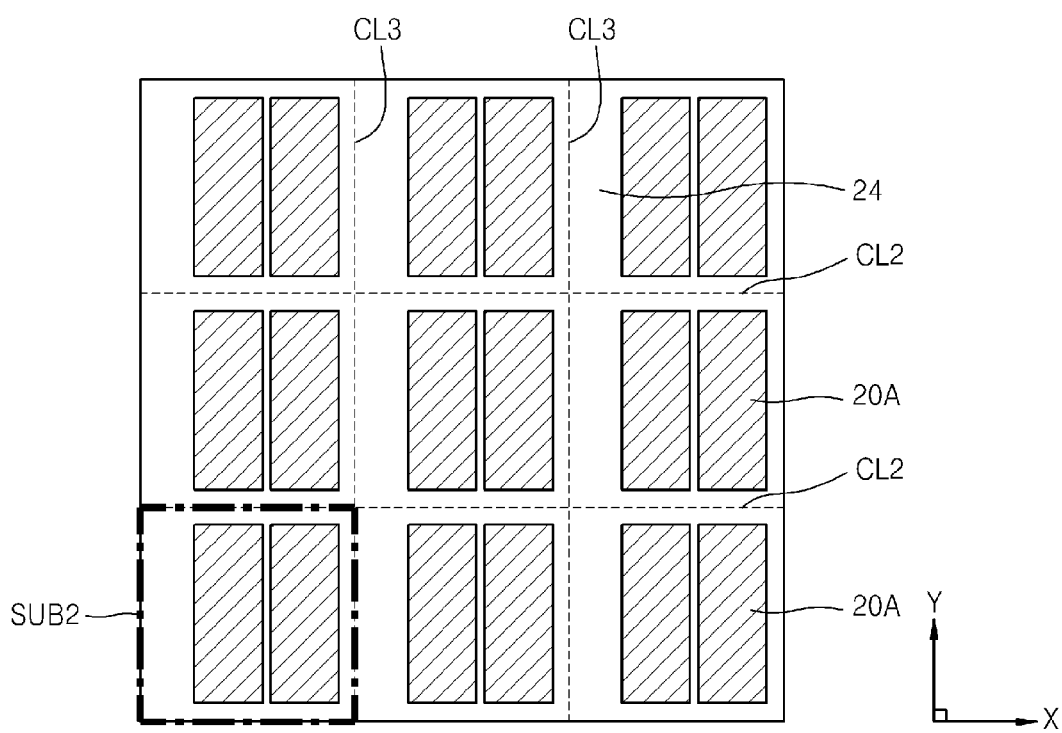

Referring to FIG. 3D, a part including the insulative metal oxide film 24 is cut along cutting lines marked with broken lines CL2 extending in the X-axis direction and broken lines CL3 extending in the Y-axis direction to form a plurality of package substrates each having a part marked with a quadrangle SUB2 depicted by an alternating long and short dashed lines as the upper surface.

Each of the plurality of package substrates may be used as the package substrate 110 shown in FIGS. 1A and 1B. The plurality of conductive regions 20A may form the first and second conductive regions 112 and 114 included in the package substrate 110 of the light-emitting device package 100 shown in FIGS. 1A and 1B.

FIGS. 4 to 9 are plan views of main structures of light-emitting device packages 200, 300, 400, 500, 600, and 700 according to other embodiments of the disclosure.

In FIGS. 4 to 9, like reference numerals in FIGS. 1A and 1B denote like members, and a detailed description thereof is omitted here for simplification of description. Although the zener diode 160 and the wire 162 shown in FIGS. 1A and 1B are omitted in FIGS. 4 to 9, the zener diode 160 and the wire 162 may be further included within the scope of the disclosure.

Figure 4:
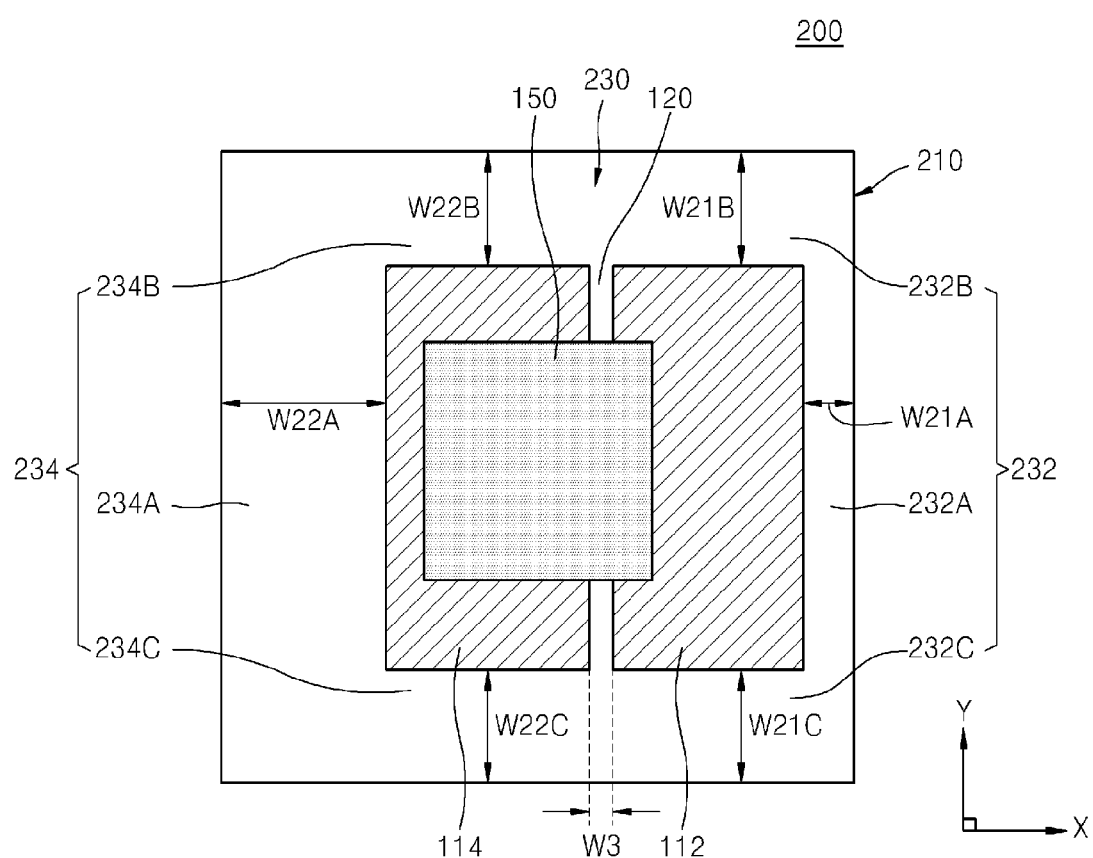
FIGS. 4 to 9 are plan views of main structures of light-emitting device packages according to other embodiments of the disclosure.

Referring to FIG. 4, the light-emitting device package 200 includes a package substrate 210. The package substrate 210 is almost similar to the package substrate 110 shown in FIGS. 1A and 1B except that a stress release portion 230 is included instead of the stress release portion 130.

The stress release portion 230 extends along an edge part of the package substrate 210 to fully surround the first and second conductive regions 112 and 114. The stress release portion 230 includes a first stress release portion 232 formed at a part having a relatively small area in the package substrate 210 divided into two parts by the electrode separator 120 and a second stress release portion 234 formed at the part having a relatively large area. Each of the first and second stress release portions 232 and 234 has a width wider than that of the electrode separator 120.

The first stress release portion 232 includes a first part 232A, which extends in the first direction (the Y-axis direction) to be parallel to the electrode separator 120 and surrounds a portion of the first conductive region 112, and a second part 232B and a third part 232C extending in the second direction (the X-axis direction) from the first part 232A and surrounding the other portion of the first conductive region 112. Each of the first, second, and third parts 232A, 232B, and 232C of the first stress release portion 232 has a width wider than the width W3 of the electrode separator 120. The first part 232A of the first stress release portion 232 has a first width W21A wider than the width W3 in the second direction (the X-axis direction), and the second and third parts 232B and 232C of the first stress release portion 232 have a second width W21B and a third width W21C wider than the first width W21A in the first direction (the Y-axis direction), respectively.

The second stress release portion 234 includes a first part 234A, which extends in the first direction (the Y-axis direction) to be parallel to the electrode separator 120 and surrounds a portion of the second conductive region 114, and a second part 234B and a third part 234C extending in the second direction (the X-axis direction) from the first part 234A and surrounding the other portion of the second conductive region 114. The first, second, and third parts 234A, 234B, and 234C of the second stress release portion 234 have first, second, and third widths W22A, W22B, and W22C wider than the first width W21A of the first part 232A of the first stress release portion 232, respectively.

The second part 232B of the first stress release portion 232 and the second part 234B of the second stress release portion 234 are integrally connected to each other. The second width W21B of the second part 232B of the first stress release portion 232 and the second width W22B of the second part 234B of the second stress release portion 234 may be the same but are not limited thereto. The third part 232C of the first stress release portion 232 and the third part 234C of the second stress release portion 234 are integrally connected to each other. The third width W21C of the third part 232C of the first stress release portion 232 and the third width W22C of the third part 234C of the second stress release portion 234 may be the same but are not limited thereto.

Figure 5:
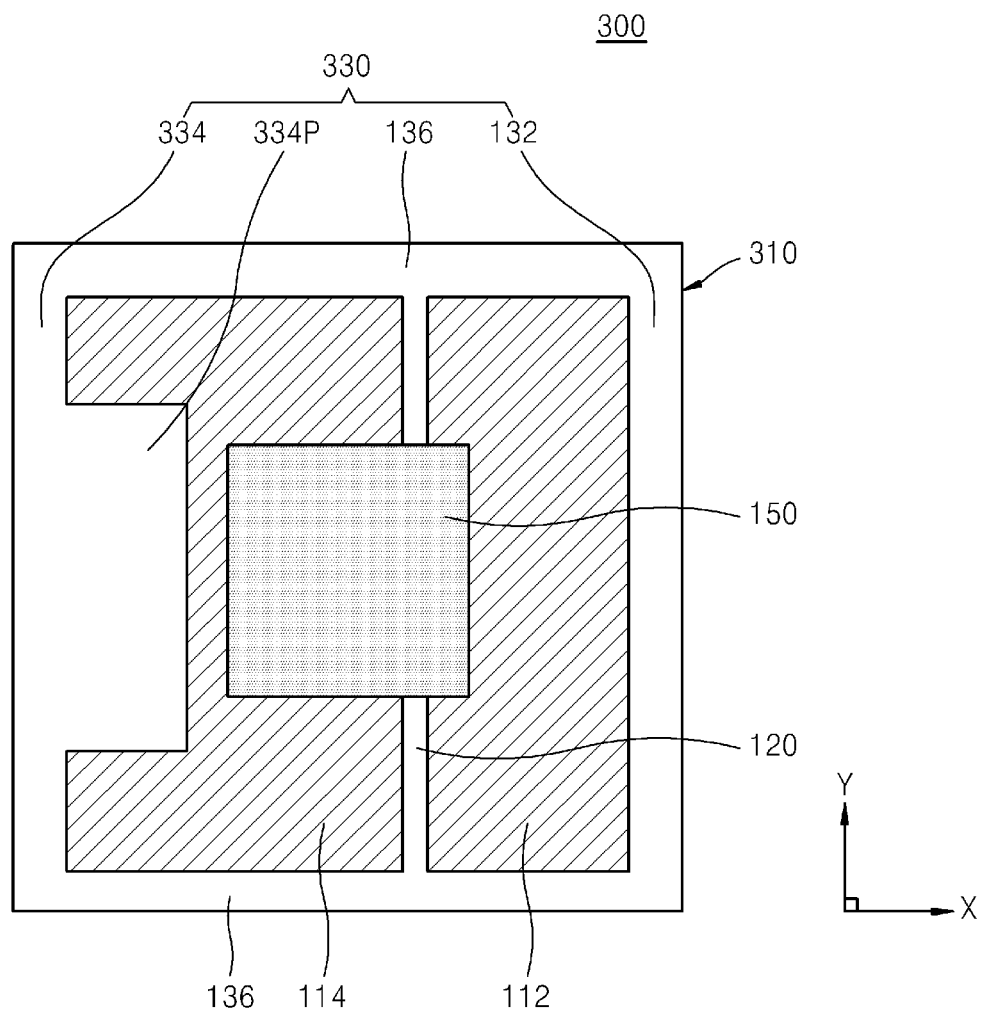

Referring to FIG. 5, the light-emitting device package 300 includes a package substrate 310. The package substrate 310 includes a stress release portion 330. The stress release portion 330 has substantially the same configuration as the stress release portion 130 shown in FIGS. 1A and 1B except that a protrusion part 334P protruding towards the light-emitting device 150 from a portion of a second stress release portion 334.

By properly adjusting a size of the protrusion part 334P, the influence of heat from the first and second conductive regions 112 and 114, which affects the light-emitting device 150, can be relatively uniformly spread. Accordingly, with the protrusion part 334P, a thermal stress at the light-emitting device 150 can be reduced.

Figure 6:
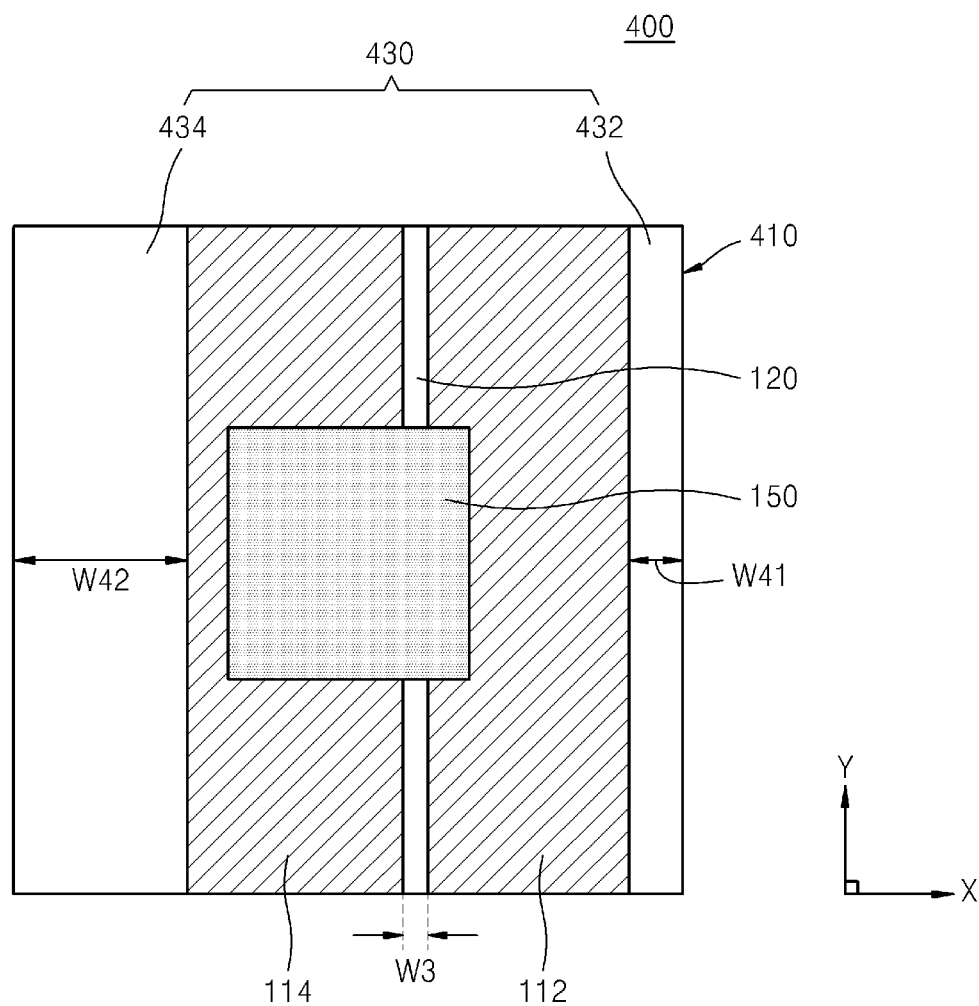

Referring to FIG. 6, the light-emitting device package 400 includes a package substrate 410. The package substrate 410 includes a stress release portion 430. The stress release portion 430 extends along a portion of an edge part of the package substrate 410 to surround only a portion of the first and second conductive regions 112 and 114. The stress release portion 430 includes first and second stress release portions 432 and 434, which are separated from each other by interposing the light-emitting device 150 therebetween. The first stress release portion 432 surrounds a portion of the first conductive region 112, and the second stress release portion 434 surrounds a portion of the second conductive region 114. The first and second stress release portions 432 and 434 have widths W41 and W42 wider than the width W3 of the electrode separator 120 in the X-axis direction, respectively. In addition, the width W42 of the second stress release portion 434 is wider than the width W41 of the first stress release portion 432.

Figure 7:
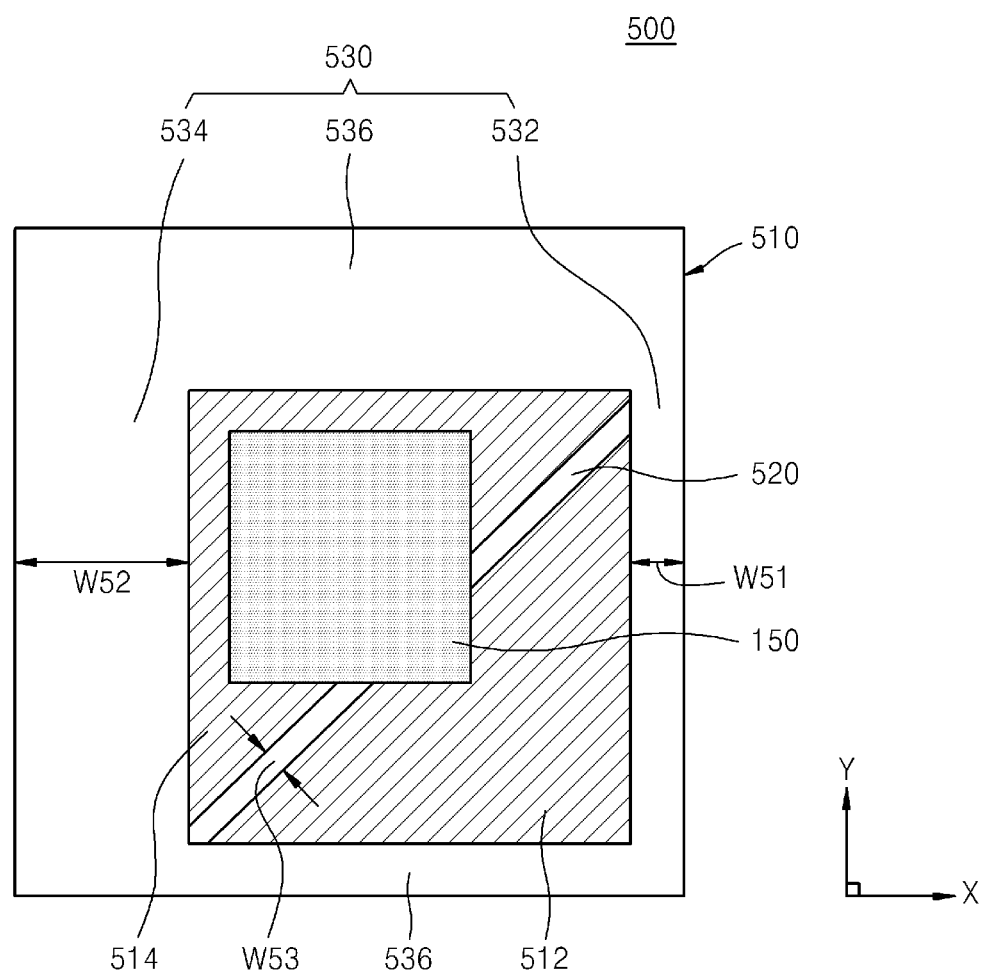

Referring to FIG. 7, the light-emitting device package 500 includes a package substrate 510. The package substrate 510 includes a stress release portion 530. The stress release portion 530 extends along an edge part of the package substrate 510 to fully surround first and second conductive regions 512 and 514. The stress release portion 530 includes a first stress release portion 532 formed at a part having a relatively small area in the package substrate 510 divided into two parts by an electrode separator 520 and a second stress release portion 534 formed at the part having a relatively large area. The first and second stress release portions 532 and 534 are integrally connected to each other through a connection part 536 extending therebetween. Although it is shown in FIG. 7 that the first and second stress release portions 532 and 534 are connected in parallel to each other, the disclosure is not limited thereto.

The first and second stress release portions 532 and 534 have widths W51 and W52 wider than a width W53 of the electrode separator 520 in a width direction (the X-axis direction) perpendicular to a length direction (the Y-axis direction), respectively. In addition, the width W52 of the second stress release portion 534 is wider than the width W51 of the first stress release portion 532.

The first and second stress release portions 532 and 534 extend parallel to each other, and the electrode separator 520 extends in a direction crossing the extending direction of the first and second stress release portions 532 and 534.

Figure 8:
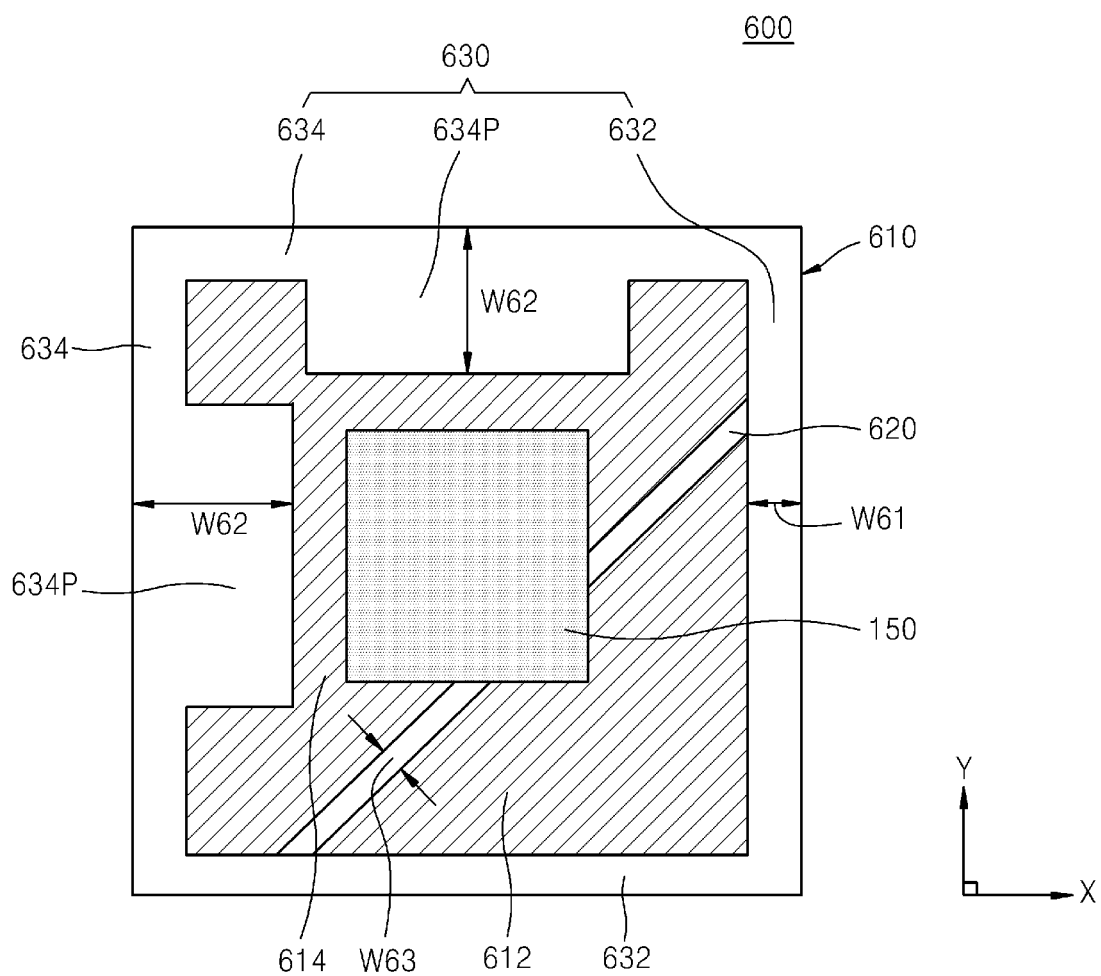

Referring to FIG. 8, the light-emitting device package 600 includes a package substrate 610. The package substrate 610 includes a stress release portion 630. The stress release portion 630 extends along an edge part of the package substrate 610 to fully surround first and second conductive regions 612 and 614. The stress release portion 630 includes a first stress release portion 632 forming a portion of the edge part of the package substrate 610 and a second stress release portion 634 forming the other portion of the edge part of the package substrate 610.

The stress release portion 630 further includes a plurality of protrusion parts 634P protruding towards the light-emitting device 150 from a portion of the second stress release portion 634. By properly adjusting sizes of the plurality of protrusion parts 634P, the influence of heat from the first and second conductive regions 612 and 614, which affects the light-emitting device 150, can be relatively uniformly spread. Accordingly, with the plurality of protrusion parts 634P, a thermal stress at the light-emitting device 150 can be reduced. Although FIG. 8 shows that the plurality of protrusion parts 634P have the same width W62, the disclosure is not limited thereto, as each of the plurality of protrusion parts 634P may have a different width.

Each of a width W61 of the first stress release portion 632 and the width W62 of each of the plurality of protrusion parts 634P in a width direction perpendicular to a length direction of each of the plurality of protrusion parts 634P is wider than a width W63 of an electrode separator 620. In addition, the width W62 of each of the plurality of protrusion parts 634P is wider than the width W61 of the first stress release portion 632. In some embodiments, each of the plurality of protrusion parts 634P may have a different width.

Figure 9:
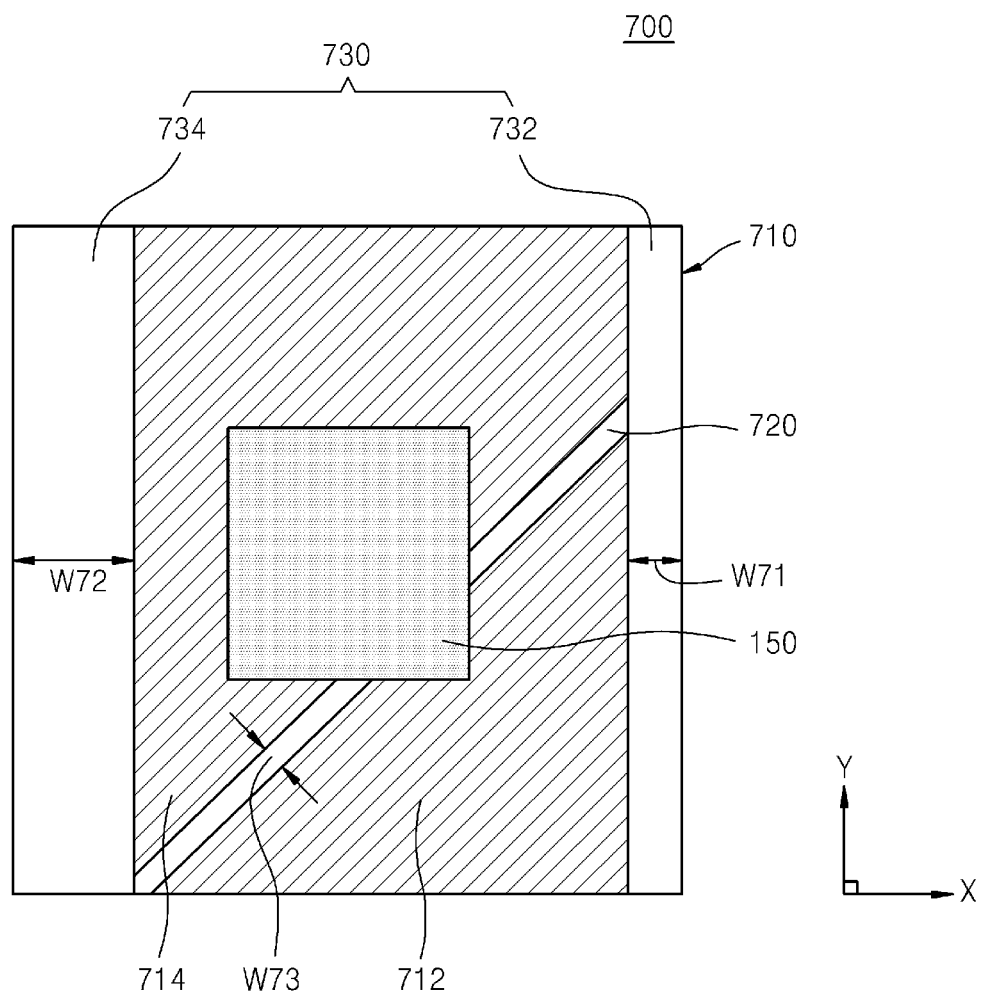

Referring to FIG. 9, the light-emitting device package 700 includes a package substrate 710. The package substrate 710 includes a stress release portion 730. The stress release portion 730 extends along a portion of an edge part of the package substrate 710 to surround only a portion of first and second conductive regions 712 and 714. The stress release portion 730 includes a first stress release portion 732 forming a portion of the edge part of the package substrate 710 and a second stress release portion 734 forming the other portion of the edge part of the package substrate 710. The first and second stress release portions 732 and 734 are separated from each other by interposing the light-emitting device 150 therebetween.

The first stress release portion 732 surrounds a portion of the first conductive region 712, and the second stress release portion 734 surrounds a portion of the second conductive region 714. The first and second stress release portions 732 and 734 have widths W71 and W72 wider than a width W73 of an electrode separator 720 in a width direction perpendicular to a length direction of the first and second stress release portions 732 and 734, respectively. In addition, the width W72 of second stress release portion 734 is wider than the width W71 of the first stress release portion 732.

The package substrates 210, 310, 410, 510, 610, and 710 of the light-emitting device packages 200, 300, 400, 500, 600, and 700 shown in FIGS. 4 to 9 may be manufactured using the method described with reference to FIGS. 2A to 2D or the method described with reference to FIGS. 3A to 3D.

Figure 10:
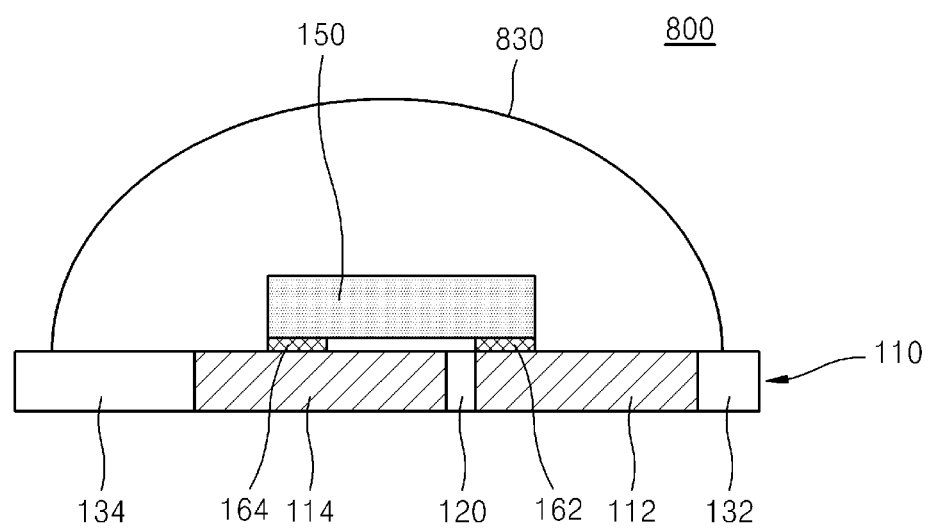
FIG. 10 is a cross-sectional view of a main structure of a light-emitting device package according to another embodiment of the disclosure.

FIG. 10 is a cross-sectional view of a main structure of a light-emitting device package 800 according to another embodiment of the disclosure. In FIG. 10, like reference numerals in FIGS. 1A and 1B denote like members, and a detailed description thereof is omitted here for simplification of description.

Referring to FIG. 10, the light-emitting device package 800 includes a lens part 830 surrounding the light-emitting device 150 mounted on the package substrate 110. In some embodiments, the inside of the lens part 830 may be filled with a silicon resin, an epoxy resin, plastic, or glass. In some other embodiments, the lens part 830 may include a refraction member inside. The refraction member may refract or reflect light emitted by the light-emitting device 150.

Figure 11:
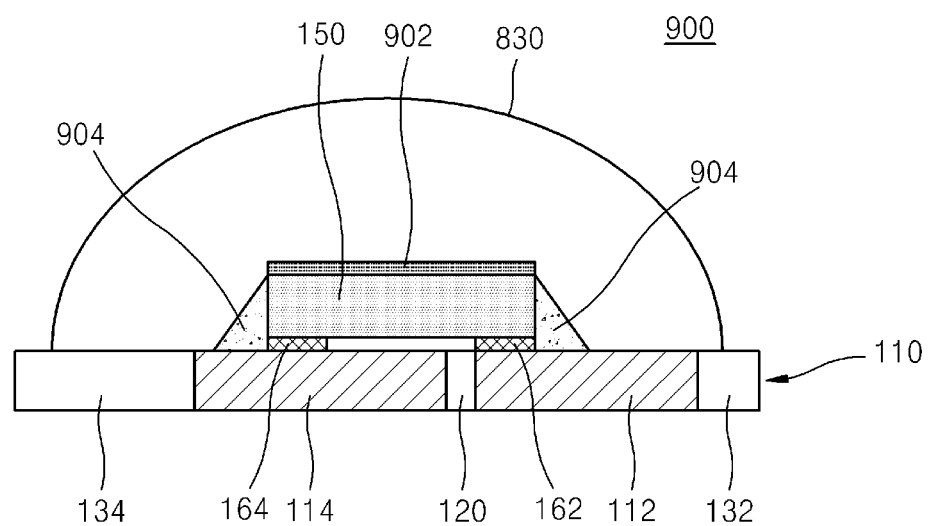
FIG. 11 is a cross-sectional view of a main structure of a light-emitting device package according to another embodiment of the disclosure.

FIG. 11 is a cross-sectional view of a main structure of a light-emitting device package 900 according to another embodiment of the disclosure. In FIG. 11, like reference numerals in FIGS. 1A, 1B, and 10 denote like members, and a detailed description thereof is omitted here for simplification of description.

Referring to FIG. 11, the light-emitting device package 900 includes a wavelength conversion layer 902 covering the light-emitting device 150 and a reflection layer 904 covering the side surfaces of the light-emitting device 150. The wavelength conversion layer 902 may convert a wavelength of light emitted by the light-emitting device 150 into another wavelength. Although FIG. 11 shows that the wavelength conversion layer 902 covers the upper surface of the light-emitting device 150, the disclosure is not limited thereto. The wavelength conversion layer 902 may be formed to cover at least a portion of a light-emitting surface of the light-emitting device 150. The wavelength conversion layer 902 may include a wavelength conversion material formed of a fluorescent substance or quantum dots. The fluorescent substance may include at least one of a yellow fluorescent substance, a green fluorescent substance, a red fluorescent substance, and a blue fluorescent substance.

The reflection layer 904 may be formed to cover a portion of the upper surface of the package substrate 110 and the side surfaces of the light-emitting device 150. In some embodiments, the reflection layer 904 may include a low reflective resin and a light-reflecting filler spread inside the low reflective resin. Light orienting to the reflection layer 904 from the light-emitting device 150 may be reflected by the light-reflecting filler in the reflection layer 904. The low reflective resin may be formed of an epoxy resin. The light-reflecting filler may be formed of a light reflective oxide, such as a titanium oxide ($TiO_2$) or a silicon oxide ($SiO_2$). In some other embodiments, the reflection layer 904 may be formed of only the low reflective resin. In this case, according to a light-incident angle, light from the light-emitting device 150 may travel through the inside of the low reflective resin or may be reflected towards the light-emitting device 150.

Figure 12:
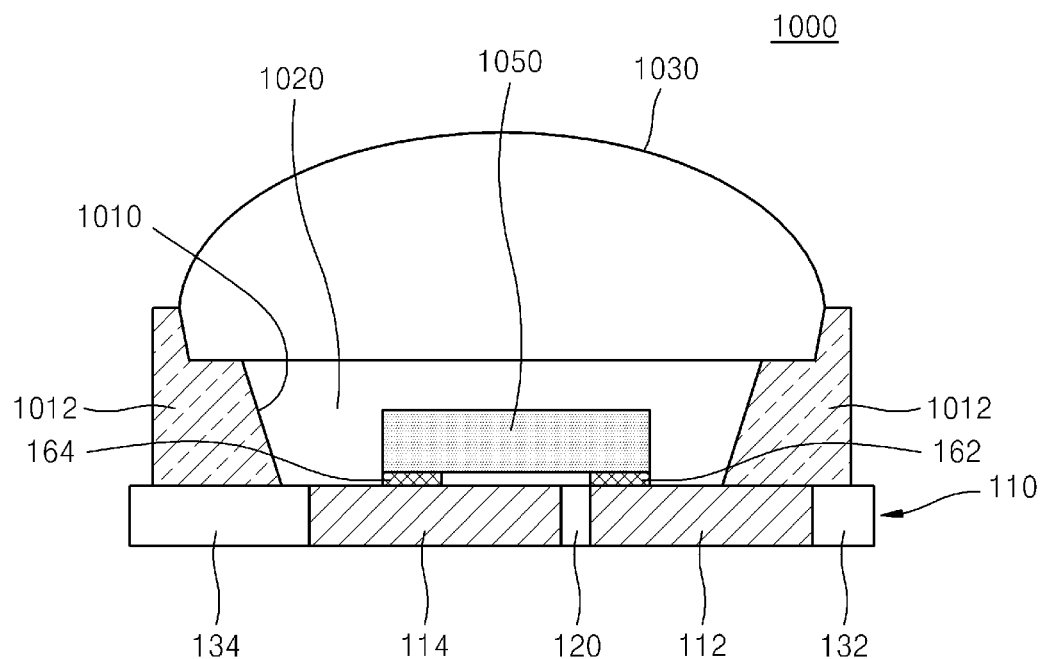
FIG. 12 is a cross-sectional view of a main structure of a light-emitting device package according to another embodiment of the disclosure.

FIG. 12 is a cross-sectional view of a main structure of a light-emitting device package 1000 according to another embodiment of the disclosure. In FIG. 12, like reference numerals in FIGS. 1A and 1B denote like members, and a detailed description thereof is omitted here for simplification of description.

Referring to FIG. 12, the light-emitting device package 1000 may include a package body 1012 delimiting a cavity 1010, a resin layer 1020 filling the cavity 1010, and a lens part 1030 disposed on the package body 1012 and the resin layer 1020. The package body 1012 may be formed of a transparent material. For example, the package body 1012 may be formed of a silicon resin, an epoxy resin, or glass.

The resin layer 1020 may include a transparent resin, such as a silicon resin or an epoxy resin. In some embodiments, the resin layer 1020 may include at least one type of a fluorescent substance or a dispersing agent. The fluorescent substance may include at least one of a yellow fluorescent substance, a green fluorescent substance, a red fluorescent substance, and a blue fluorescent substance.

The lens part 1030 may collect light emitted by the light-emitting device 150. In some embodiments, at least a portion of the inside of the lens part 1030 may include a fluorescent substance or a color conversion material. When the fluorescent substance is included inside the lens part 1030, a wavelength of the light emitted by the light-emitting device 150 may be converted. The lens part 1030 may be filled with a silicon resin, an epoxy resin, plastic, or glass.

In some embodiments, the resin layer 1020 and the lens part 1030 may be formed of a same material and may be formed as one body. In this case, the resin layer 1020 and the lens part 1030 may be formed at the same time.

Figure 13:
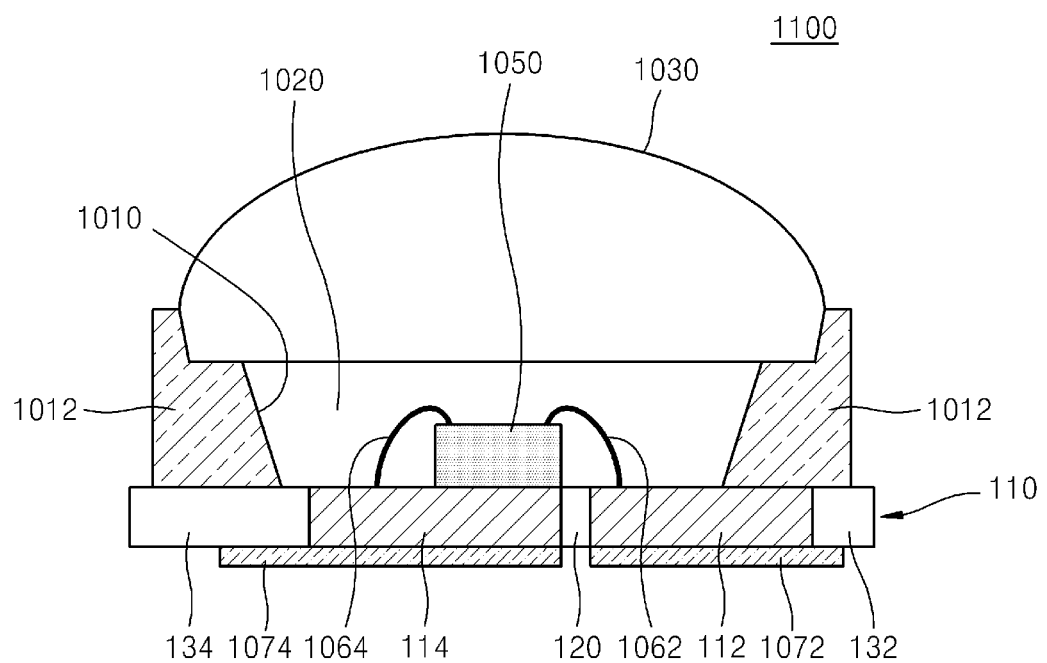
FIG. 13 is a cross-sectional view of a main structure of a light-emitting device package according to another embodiment of the disclosure.

FIG. 13 is a cross-sectional view of a main structure of a light-emitting device package 1100 according to another embodiment of the disclosure. In FIG. 13, like reference numerals in FIGS. 1A, 1B, and 12 denote like members, and a detailed description thereof is omitted here for simplification of description.

Referring to FIG. 13, the light-emitting device package 1100 has substantially the same configuration as the light-emitting device package 1000 shown in FIG. 12. However, a light-emitting device 1050 is mounted on the second conductive region 114. A cathode and an anode of the light-emitting device 1050 may be connected to the first and second conductive regions 112 and 114 by bonding wires 1062 and 1064, respectively. In some embodiments, the cathode of the light-emitting device 1050 may be connected to the first conductive region 112, and the anode of the light-emitting device 1050 may be connected to the second conductive region 114. In some other embodiments, the cathode of the light-emitting device 1050 may be connected to the second conductive region 114, and the anode of the light-emitting device 1050 may be connected to the first conductive region 112.

A first rear surface electrode 1072 and a second rear surface electrode 1074 electrically connectable to the first conductive region 112 and the second conductive region 114 are formed on the lower surface of the package substrate 110, respectively. The first and second conductive regions 112 and 114 may respectively receive power from the outside via the first and second rear surface electrodes 1072 and 1074 and may supply driving power to the light-emitting device 1050 and the zener diode 160 (refer to FIG. 1A). The first and second rear surface electrodes 1072 and 1074 may be formed using a sputtering method, an electrolytic plating method, a non-electrolytic plating method, or a screen printing method. In some embodiments, the first and second rear surface electrodes 1072 and 1074 may be omitted.

Figure 14:
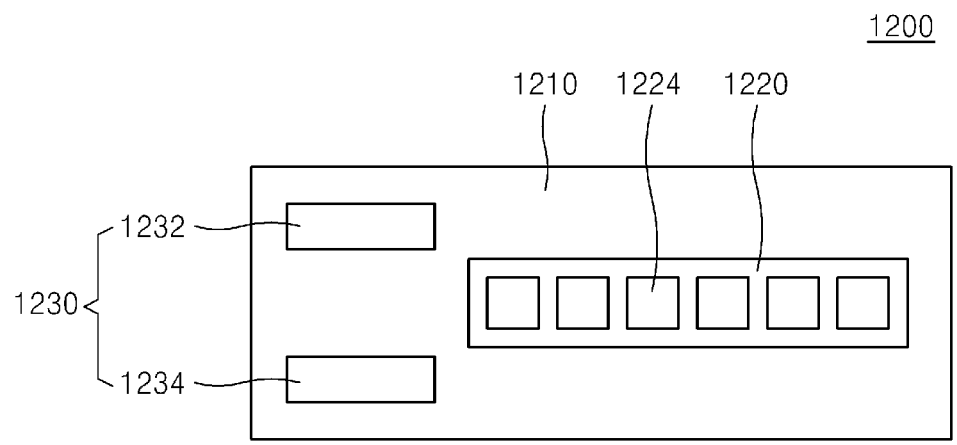
FIG. 14 is a plan view of a dimming system including a light-emitting device package according to an embodiment of the disclosure.

FIG. 14 is a top view of a dimming system 1200 including a light-emitting device package according to an embodiment of the disclosure. Referring to FIG. 14, the dimming system 1200 includes a light-emitting module 1220 and a power supply unit 1230, which are disposed on a structure 1210.

The light-emitting module 1220 includes a plurality of light-emitting device packages 1224. The plurality of light-emitting device packages 1224 include at least one of the light-emitting device packages 100, 200, 300, 400, 500, 600, 700, 800, 900, 1000, and 1100 described with reference to FIGS. 1A to 13.

The power supply unit 1230 includes an interface 1232 for receiving power and a power controller 1234 for controlling power to be supplied to the light-emitting module 1220. The interface 1232 may include a fuse for cutting off an overcurrent and an electronic wave shielding filter for shielding an electronic wave obstacle signal. The power controller 1234 may include a rectification unit and an equalization unit for converting an alternating current (AC) to a direct current (DC) when AC power is input as power, and a constant voltage controller for converting a DC voltage to a voltage suitable for the light-emitting module 1220. The power supply unit 1230 may include a feedback circuit device for comparing the intensity of light emitted by each of the plurality of light-emitting device packages 1224 with a preset light intensity and a memory device for storing information, such as a desired brightness, color rendering, and so forth.

The dimming system 1200 may be used for backlight units used in display devices, such as liquid crystal display devices having an image panel and the like, indoor lighting devices, such as lamps, flat board lighting, and the like, and outdoor lighting devices, such as street lights, sign boards, street signs, and the like. In addition, the dimming system 1200 may be used for various lighting devices for various traffic means, e.g., lighting devices for vehicles, vessels, and airplanes, electric home appliances, such as TVs, refrigerators, and so forth, and medical equipment.

Figure 15:
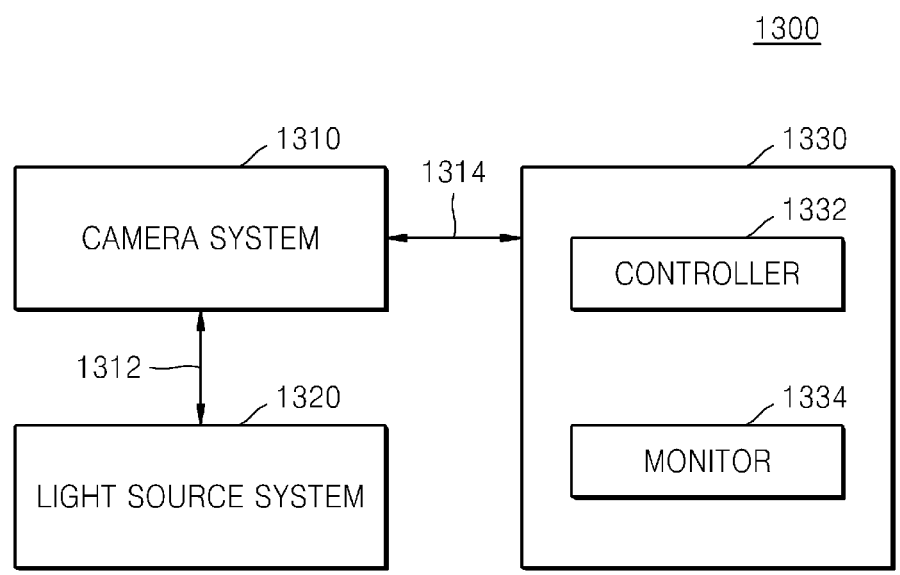
FIG. 15 is a block diagram of an optical processing system including a light-emitting device package according to an embodiment of the disclosure.

FIG. 15 is a block diagram of an optical processing system 1300 including a light-emitting device package according to an embodiment of the disclosure. Referring to FIG. 15, the optical processing system 1300 includes a camera system 1310, a light source system 1320, and a data processing and analyzing system 1330.

The camera system 1310 may be used by directly contacting an object to be optically processed or by being disposed to orient to the object to be optically processed in a state of being apart by a predetermined distance from the object to be optically processed. In some embodiments, the object to be optically processed may be biological tissue, such as a skin or a part to be treated. The camera system 1310 is connected to the light source system 1320 through a light guide 1312. The light guide 1312 may include an optical fiber light guide or a liquid light guide capable of optical transmission.

The light source system 1320 provides light to be irradiated on the object to be optically processed through the light guide 1312. The light source system 1320 includes at least one of the light-emitting device packages 100, 200, 300, 400, 500, 600, 700, 800, 900, 1000, and 1100 described with reference to FIGS. 1A to 13. In some embodiments, the light source system 1320 may generate and oscillate ultraviolet rays and irradiate the ultraviolet rays on biological tissue, such as a skin or a disease part.

The camera system 1310 is connected to the data processing and analyzing system 1330 through a cable 1314. An image signal output from the camera system 1310 may be transmitted to the data processing and analyzing system 1330 through the cable 1314. The data processing and analyzing system 1330 includes a controller 1332 and a monitor 1334. The data processing and analyzing system 1330 may process, analyze, and store the image signal transmitted from the camera system 1310.

The optical processing system 1300 shown in FIG. 15 may be applied to various application fields, such as skin diagnosis devices, medical treatment devices, sterilization devices, disinfection devices, cleaning devices, surgical supplies, cosmetic medical devices, lighting devices, information sensing devices, and the like.

While the disclosure has been particularly shown and described with reference to exemplary embodiments thereof, it will be understood that various changes in form and details may be made therein without departing from the spirit and scope of the following claims.

What is claimed is:

1. A light-emitting device package comprising:
a package substrate; and
a light-emitting device mounted on the package substrate,
wherein the package substrate comprises:
first and second conductive regions each having a portion overlapping the light-emitting device;
an electrode separator extending across the package substrate while penetrating the package substrate between the first and second conductive regions to electrically separate the first and second conductive regions from each other; and
a stress release portion surrounding at least a portion of each of the first and second conductive regions at an edge part of the package substrate and having different widths on both sides of the electrode separator interposed therebetween.

2. The light-emitting device package of claim 1, wherein the electrode separator and the stress release portion are formed of a same material.

3. The light-emitting device package of claim 1, wherein the electrode separator extends in a first direction, and the stress release portion has a width in a second direction perpendicular to the first direction, which is wider than a width of the electrode separator in the second direction.

4. The light-emitting device package of claim 1, wherein the package substrate comprises a first substrate portion in which the first conductive region is located, the first substrate portion having a first area, and a second substrate portion in which the second conductive region is located, the second substrate portion having a second area greater than the first area, and
wherein the stress release portion comprises a first stress release portion, which has a first width in the first substrate portion and surrounds at least a portion of the first conductive region, and a second stress release portion, which has a second width wider than the first width in the second substrate portion and surrounds at least a portion of the second conductive region.

5. The light-emitting device package of claim 4, wherein the first stress release portion, the second stress release portion, and the electrode separator extend parallel to each other.

6. The light-emitting device package of claim 4, wherein the first stress release portion and the second stress release portion extend parallel to each other, and the electrode separator extends in a direction crossing the extending direction of the first and second stress release portions.

7. The light-emitting device package of claim 4, wherein the stress release portion extends along an edge part of the package substrate to fully surround the first and second conductive regions.

8. The light-emitting device package of claim 4, wherein the second stress release portion comprises a protrusion part protruding towards the light-emitting device.

9. The light-emitting device package of claim 4, wherein the light-emitting device extends across the electrode separator to overlap the first and second conductive regions.

10. The light-emitting device package of claim 1, further comprising conductive bonding layers interposed between the light-emitting device and the first conductive region and between the light-emitting device and the second conductive region.

11. The light-emitting device package of claim 1, further comprising conductive wires connected between the light-emitting device and the first conductive region and between the light-emitting device and the second conductive region.

12. The light-emitting device package of claim 1, further comprising:
a zener diode mounted on any one of the first and second conductive regions; and
a conductive wire connected between another one of the first and second conductive regions and the zener diode.

13. A light-emitting device package comprising:
a package substrate including first and second conductive regions, which are separated from each other by an electrode separator, and a stress release portion surrounding at least a portion of each of the first and second conductive regions; and
a light-emitting device overlapping the first and second conductive regions and extending across the electrode separator,
wherein the stress release portion comprises a first stress release portion, which has a first width and surrounds at least a portion of the first conductive region, and a second stress release portion, which has a second width that is wider than the first width and surrounds at least a portion of the second conductive region.

14. The light-emitting device package of claim 13, wherein each of the first conductive region and the second conductive region is formed of a metal, and each of the electrode separator and the stress release portion is formed of an insulative metal oxide.

15. The light-emitting device package of claim 13, further comprising:
a zener diode mounted on any one of the first and second conductive regions; and
a conductive wire connected between an other one of the first and second conductive regions and the zener diode.

16. The light-emitting device package of claim 13, further comprising:
a wavelength conversion layer covering the light-emitting device; and
a lens covering the first conductive region, the second conductive region, the light-emitting device, and the wavelength conversion layer on the package substrate.

* * * * *